United States Patent
Milne et al.

(10) Patent No.: US 10,466,960 B2
(45) Date of Patent: Nov. 5, 2019

(54) AUGMENTED REALITY AUDIO MIXING

(71) Applicant: Avid Technology, Inc., Burlington, MA (US)

(72) Inventors: Steven H. Milne, Palo Alto, CA (US); Stephen Wilson, San Francisco, CA (US); Edward Jones, Boulder Creek, CA (US); Robert Boyer, Los Gatos, CA (US); David K. Magleby, Cupertino, CA (US); Eduardo Dias Trama, San Jose, CA (US); Konstantine Baranov, Bloom, IN (US)

(73) Assignee: AVID TECHNOLOGY, INC, Burlington, MA (US)

( * ) Notice: Subject to any disclaimer, the term of this patent is extended or adjusted under 35 U.S.C. 154(b) by 0 days.

(21) Appl. No.: 15/943,153

(22) Filed: Apr. 2, 2018

(65) Prior Publication Data
US 2019/0303090 A1    Oct. 3, 2019

(51) Int. Cl.
*G06F 3/16*      (2006.01)
*G06F 3/0484*    (2013.01)
(Continued)

(52) U.S. Cl.
CPC .......... *G06F 3/165* (2013.01); *G02B 27/017* (2013.01); *G06F 3/017* (2013.01);
(Continued)

(58) Field of Classification Search
CPC .. G06F 3/017; G06F 3/04815; G06F 3/04847; G06F 3/165; G06F 3/011;
(Continued)

(56) References Cited

U.S. PATENT DOCUMENTS

| 2008/0229200 A1* | 9/2008 | Fein ..................... G11B 27/34 715/716 |
| 2013/0335321 A1* | 12/2013 | Sugita ................... G06F 3/0488 345/157 |

(Continued)

FOREIGN PATENT DOCUMENTS

WO    WO-2016071697 A1 *   5/2016   ............... H04S 7/30

*Primary Examiner* — Scott T Baderman
*Assistant Examiner* — Seung Woon Jung
(74) *Attorney, Agent, or Firm* — Oliver Strimpel

(57) ABSTRACT

Augmented reality enables an operator to visualize values of parameters of audio channels during audio mixing. A heads-up display worn by the operator, such as smart glasses, displays virtual graphical objects representing the parameters so that they appear within a three-dimensional space surrounding the operator and an audio mixing console. Parameter values are represented by the location, size, and other attributes of the virtual graphical objects. The operator adjusts the parameter values using physical and touch controls on the console and by manipulating the virtual objects with a body part such as a finger. Sensors mounted on the heads-up display and on other body parts capture position and movement of the operator in real time and send the captured data to a system running augmented reality control software. Graphical user interfaces of a media processing application controlled by the console and of plug-in modules may also be displayed on the heads-up display.

15 Claims, 8 Drawing Sheets

(51) Int. Cl.
  *G06F 3/0481*  (2013.01)
  *G06T 19/00*  (2011.01)
  *H03G 5/16*  (2006.01)
  *G06F 3/01*  (2006.01)
  *H04S 3/00*  (2006.01)
  *G02B 27/01*  (2006.01)
  *H04H 60/04*  (2008.01)

(52) U.S. Cl.
  CPC ...... *G06F 3/04815* (2013.01); *G06F 3/04847* (2013.01); *G06T 19/006* (2013.01); *H03G 5/165* (2013.01); *H04H 60/04* (2013.01); *H04S 3/008* (2013.01); *G02B 2027/0178* (2013.01); *H04S 2400/01* (2013.01)

(58) Field of Classification Search
  CPC ........ F06T 15/00; F06T 19/006; H04H 60/04; G02B 2027/0163; G02B 2027/0178
  See application file for complete search history.

(56) References Cited

U.S. PATENT DOCUMENTS

| | | | |
|---|---|---|---|
| 2014/0281979 A1* | 9/2014 | Milne | G06F 3/048 715/716 |
| 2015/0067511 A1* | 3/2015 | Lee | G06F 3/165 715/716 |
| 2017/0041730 A1* | 2/2017 | Seligmann | H04S 7/303 |
| 2018/0109899 A1* | 4/2018 | Arana | H04S 7/302 |
| 2018/0150275 A1* | 5/2018 | Mate | G06F 3/165 |
| 2018/0157044 A1* | 6/2018 | Choi | G02B 27/01 |
| 2018/0352360 A1* | 12/2018 | Chen | H04S 7/303 |
| 2018/0357038 A1* | 12/2018 | Olivieri | G06F 3/165 |
| 2019/0026071 A1* | 1/2019 | Tamaoki | A63F 13/25 |

* cited by examiner

AUGMENTED REALITY AUDIO MIXING

BACKGROUND

Audio mixing tools are used in a wide array of settings, including those where it is advantageous for audio mixers to use consoles having a small footprint for which there is only a limited amount of space for displays. In some environments, the cost of the mixing equipment is an important consideration, and, since, OLEDs and LCDs and their associated electronics is expensive, these may be kept to small sizes, or even eliminated entirely. Furthermore, mixing console lack 3D displays. Despite these output limitations, audio engineers wish to retain as much of the mixing functionality and ease-of-use that is available in the traditional, larger consoles. When mixing the audio for a film, an audio engineer needs to look at the screen showing the video in order to ensure that the audio is correctly tailored to the picture. In such situations, the visual focus of the engineer jumps from screen to console frequently, and it is important to minimize the time and effort required for the engineer to locate and adjust the desired audio parameters. There is therefore a need to adapt mixing console interfaces to facilitate full-function and intuitive audio mixing in small, low cost mixing systems.

SUMMARY

In general, the methods, systems, and computer program products described herein enable the mixing of audio using interfaces based in part on augmented reality. New interfaces support new modalities of visualizing and adjusting audio parameter values, including three-dimensional spatial parameters for placing sound sources within a three-dimensional space, such as a film theater.

In general, in one aspect, a method of mixing a plurality of audio channels of a media project comprises: providing an audio mixing console for mixing the plurality of audio channels of the media project; providing smart glasses for an operator of the audio mixing console, wherein the audio mixing console and the smart glasses are in data communication with a computer hosting augmented reality software; and while the operator is wearing the smart glasses, displaying on the smart glasses a graphical representation of a value of a parameter of a given audio channel, wherein the graphical representation of the value of the parameter appears to the operator to be positioned at a spatial location within a three-dimensional space surrounding the operator, and the audio mixing console.

Various embodiments include one or more of the following features. The operator is able to adjust the value of the parameter while wearing the smart glasses, and wherein the graphical representation of the value of the parameter is updated in real-time to represent a current value of the parameter. The user is able to adjust the value of the parameter by manipulating a physical control on the audio mixing console. The operator is able to adjust the value of the parameter by touching a touchscreen control on the audio mixing console. The operator is able to adjust the value of the parameter by using gestures that appear to interact in the three-dimensional space with the graphical representation of the value of the parameter. The parameter of the given audio channel defines a spatial location of a source of the given audio channel within the three-dimensional space, and the spatial location within the three-dimensional space of the graphical representation of the parameter indicates the spatial location of the source of the given audio channel. One or more of the size, shape, or color of the graphical representation of the parameter is indicative of the parameter value. The spatial location of the graphical representation of the parameter value indicates a location of a control of the mixing console that is assigned to control the value of the parameter. The graphical representation comprises an analog representation of the value of the parameter. The graphical representation includes rendered text indicative of the value of the parameter. The graphical representation includes a name of the parameter. The parameter is an equalization parameter of the given channel. The graphical representation of the parameter value is a graph. The media project comprises time-synchronous video and audio; the time-synchronous video is displayed on a display within the three-dimensional space surrounding the operator and the mixing console; a source object for the given audio channel is depicted in the displayed time-synchronous video; and the spatial location of the graphical representation of the value of the parameter appears to coincide with a spatial location within the displayed time-synchronous video of the depicted source object. The parameter is a spatial parameter or a non-spatial of the given audio channel. The graphical representation of the value of the parameter is displayed within a graphical user interface of a media processing application, and the graphical user interface of the media processing application appears to the operator to be positioned on a surface of the three-dimensional space surrounding the operator. The display on the smart glasses includes graphical representations of values of a plurality of audio mixing parameters including the graphical representation of the value of the parameter of the given audio channel. The computer running the augmented reality control software is embedded within the audio mixing console.

In general, in another aspect, a system for audio mixing comprises: a control system in data communication with augmented reality smart glasses and with an audio mixing console, wherein the augmented reality smart glasses includes a three-dimensional position sensor, wherein the control system is configured to: receive from the audio mixing console a value of a parameter of a given audio channel that is being mixed by an operator of the audio mixing console while the operator is wearing the augmented reality smart glasses; in response to receiving the parameter value, generate data representing a graphical representation of the parameter value; sending the data representing the graphical representation of the parameter value to the augmented reality smart glasses, wherein the augmented reality smart glasses receives the data representing the graphical representation of the parameter value and displays the graphical representation of the parameter value so that it appears to the operator to be located within a three-dimensional space that surrounds the operator and the mixing console.

Various embodiments include one or more of the following features. The operator uses a control of the audio mixing console to adjust the value of the parameter of the given audio channel and the control system in real-time: receives an adjusted value of the parameter; generates in real-time data representing a graphical representation of the adjusted value of the parameter; and sends the data representing the graphical representation of the adjusted value of the parameter value to the augmented reality smart glasses; and the augmented reality smart glasses receives the data representing the graphical representation of the adjusted value of the parameter value and displays the graphical representation of the adjusted parameter value. The system includes a three-dimensional position sensor in data communication with the control system, wherein: the three-dimensional position sensor tracks a movement of the operator and sends data representing the tracked movement to the control system; the control system in real-time: interprets the tracked movement as an instruction to adjust the value of the parameter and generates in real-time data representing a graphical representation corresponding to an adjusted value of the parameter; and sends the data representing the graphical representation of the adjusted value of the parameter value to the augmented reality smart glasses; and the augmented reality smart glasses receives the data representing the graphical representation of the adjusted value of the parameter value and displays the graphical representation of the adjusted parameter value. The parameter value represents a spatial position of the given audio channel, and wherein interacting with the displayed representation of the parameter value includes moving the graphical representation within the three-dimensional space. The graphical representation represents a numerical value of the parameter and interacting with the displayed representation of the parameter value includes moving a feature of the graphical representation to increase or decrease the numerical value of the parameter.

DETAILED DESCRIPTION

Audio mixing is characterized by the need for ready access to a large number of controls. For example, it is common have 100 or more input channels which are to be mixed down to just two channels in a stereo mix, or to 5 channels in a 5.1 mix. In traditional systems, a large console might devote an entire channel strip to each of the input channels, with the result that such consoles tend to be large, measuring over 20 feet long. In order to meet the demand for small, inexpensive consoles, mixing console manufacturers have developed systems with smaller footprints, such as a standard rack mounted dimension of 19 by 20 inches, having a reduced number of channel strips, each of which can be allocated to a channel selected by the user. Modular control surfaces enable users to configure consoles to their needs by populating a chassis equipped with standard size buckets with standardized modules, such as fader, knob, switch, and display modules. When space and funds are limited, a user may reduce the number of display modules, or dispense with such modules entirely.

Figure 1:
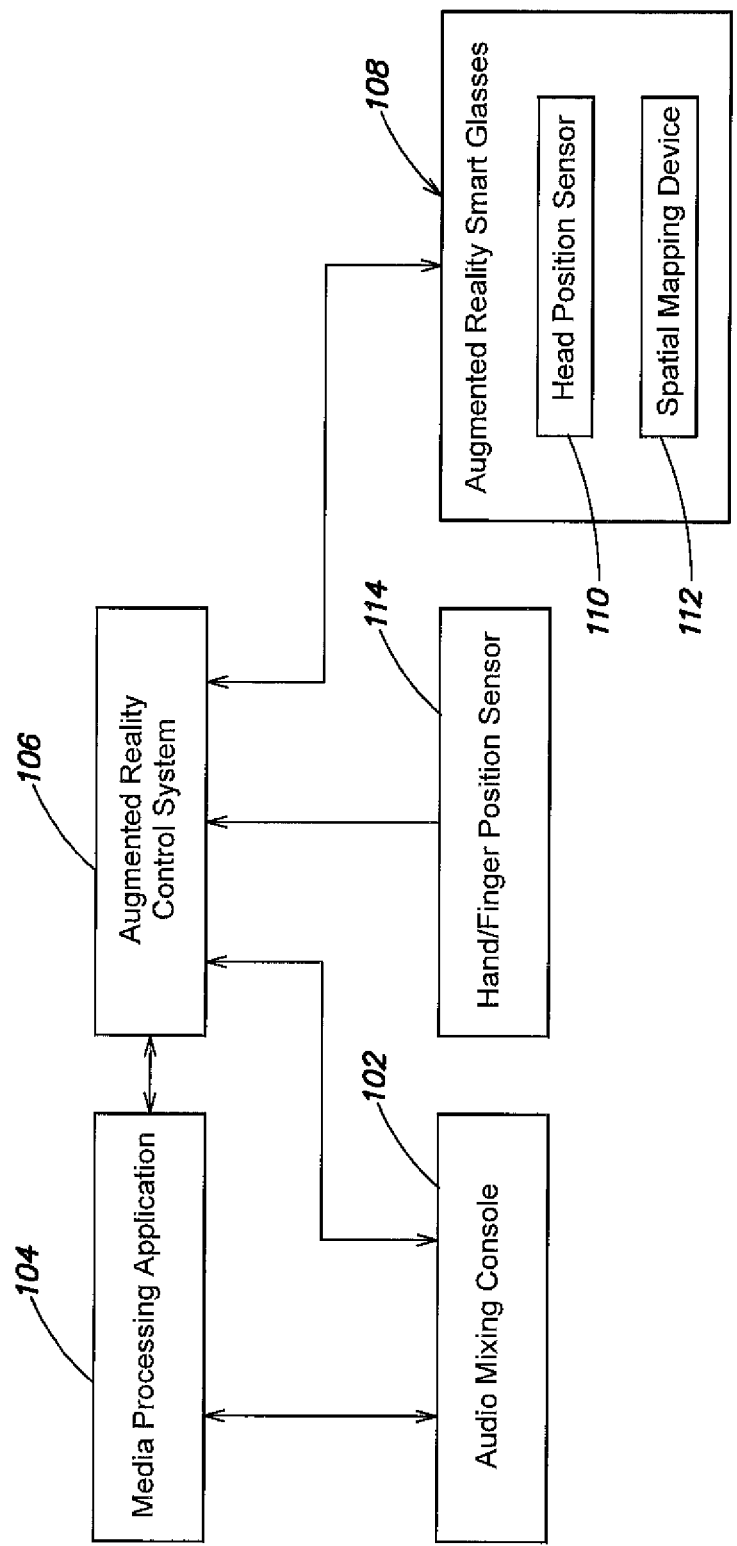
FIG. 1 is a high-level block diagram of the components of an augmented-realty-assisted audio mixing system.

Augmented reality provides a means of expanding and enhancing the user interface in mixing consoles in which traditional user interface real estate has been curtailed as a result of cost and/or size constraints. In such systems, the mix engineer wears augmented reality smart glasses such as the Microsoft® HoloLens®. The engineer is able to see the real world through the glasses, while computer-generated images are superimposed over the real world. FIG. 1 illustrates a system for providing a user interface with augmented reality for an audio engineer. Mixing console 102 that is being used to control media processing application 104, such as a digital audio workstation, is in data communication with augmented reality control system 106 that hosts augmented reality software. In various implementations, augmented reality controller 106 is a module within mixing console 102 or a part of media processing application 104. In some applications, such as in live performance mixing, no media processing application is used. The audio engineer wears augmented reality smart glasses 108, which includes head position sensor 110 that transmits the location of the wearer's head, and thus tracks head translations and rotations. The tracked head movements may result from movements of the head of an otherwise stationary wearer, and/or movements resulting from the wearer moving around the space, e.g., a dub stage or mixing studio. The augmented reality smart glasses may also include spatial mapping device 112 which maps the space in which the audio engineer and the mixing console are located. The spatial mapping uses one or more of visible light, infrared, and sonar to generate the three-dimensional map of the room. The user's movement of hands and fingers may be measured by hand/finger position sensor 114, which may be implemented as one or more sensors attached to a hand-held controller or a glove. In other implementations, the hand and finger movements may be tracked using the same sensors (e.g., optical or infrared) used by the spatial mapping device of the augmented reality glasses. Gestures may be detected using image recognition techniques. Other sensors may be deployed to detect movement of other parts of the user's body, such as arms. The output of the 3D position sensor, hand/finger sensor, and any other position or movement sensors is transmitted to control system 106. The control system in turn interprets the received user position information to update a display on the smart glasses. Specific movements of the hands, fingers, and in some cases also the arm, may be interpreted as gestures for manipulating virtual objects appearing in the smart glasses display, or for performing other mixing functions. Gestures or movements that control parameters or constitute other mixing commands are forwarded by control system 106 to mixing console 102, and, if present, to media processing application 104.

Figure 2:
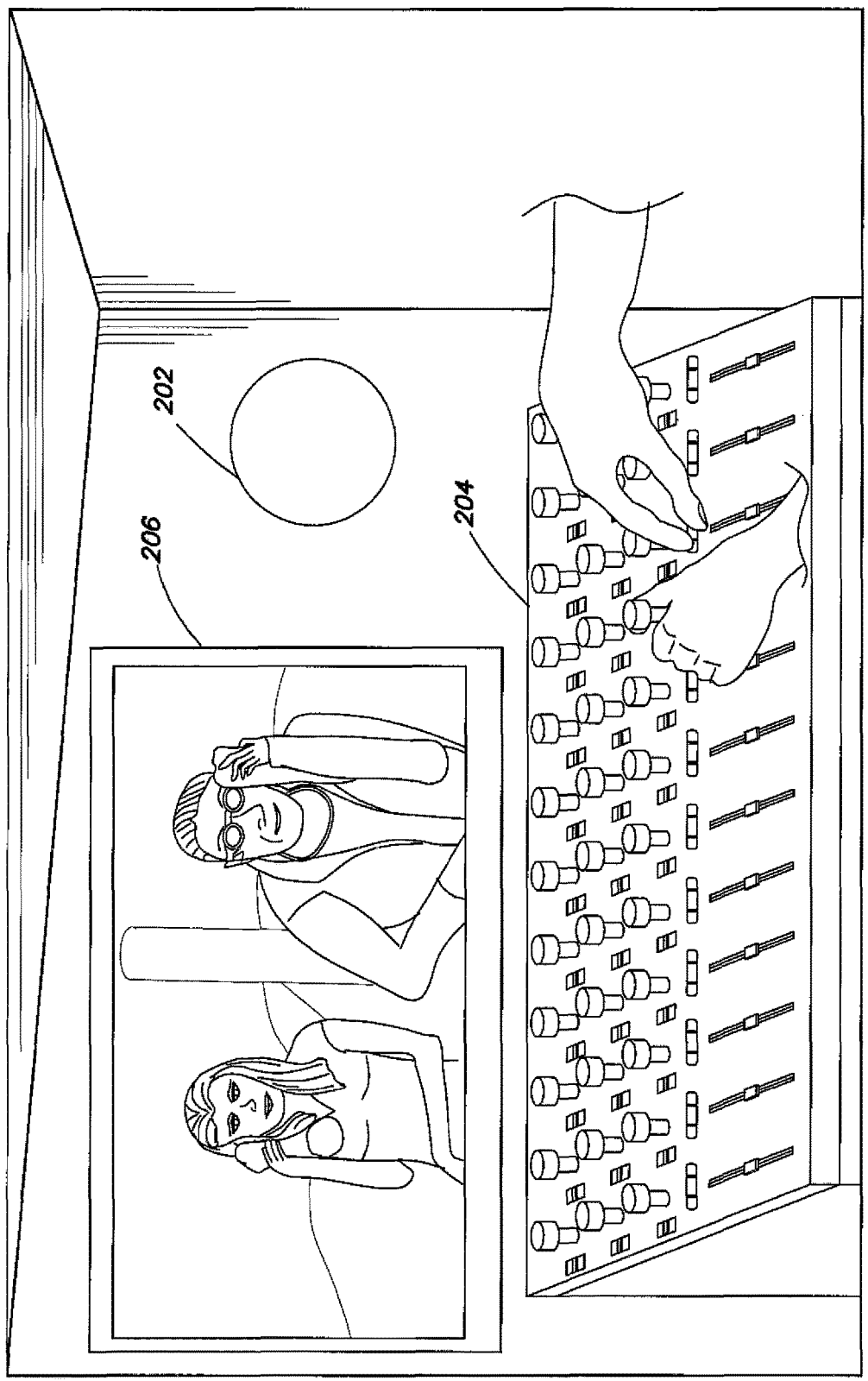
FIG. 2 illustrates the visualization of a spatial location of an audio channel by displaying a virtual graphical object on a heads-up display.

We now describe examples of the application of augmented reality in an audio mixing environment. FIG. 2 illustrates the use of augmented reality to display a shape, such as sphere 202 showing the 3D spatial position of sound on a dub stage. The sound whose position is shown in this manner is the track that is attentioned on console 204. The user pans the position of the sound in three dimensions using the mixing console by means of two joysticks, a single joystick for two of the dimensions and a knob for the third, or with three knobs, one for each dimension. As the user adjusts the sound position, the apparent position of the sphere is updated to represent the current sound location by moving its position left and right, up and down, and making it larger or smaller to indicate distance from the user. While adjusting the 3D position of the sound, the operator does not need to look away from screen 206 which shows the picture that corresponds to the audio. Alternatively, a user may adjust the sound position by direct manipulation of the virtual object. For example, he may grasp or push the virtual object and move it around with hand movements in three dimensions. The position and gestures of the hand are captured by hand/finger position sensor 114 (FIG. 1), and relayed to augmented reality control system 106. The control system updates the display on smart glasses 108 to reflect any sound position adjustments. The ability to show and manipulate in an intuitive fashion the 3D position of a track is especially useful when editing a 3D format such as Dolby Atmos® or Ambisonics, in which the performance venue is able to reproduce a sound in three dimensions.

Figure 3:
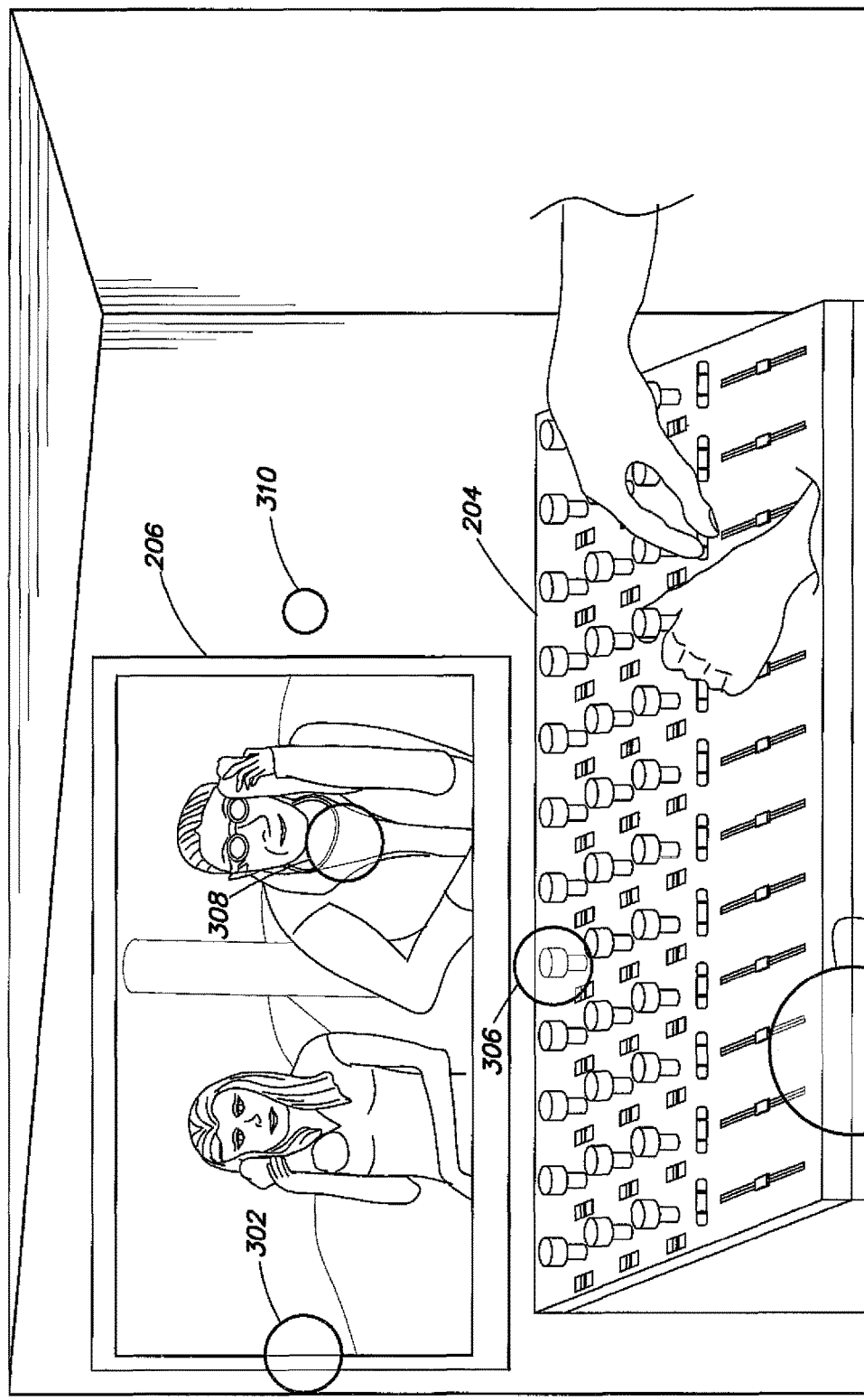
FIG. 3 illustrates the visualization of spatial locations of multiple audio channels by displaying a virtual graphical object for each of the audio channels on a heads-up display.

A similar representation of the 3D position of a track can be used to show the 3D positions of some or all of the tracks in a mix simultaneously. FIG. 3 illustrates a scenario in which the positions of six tracks are shown as spheres 302, 304, 306, 308, 310, and 312 in the augmented reality display. Using a filter, a subset of tracks in a session may selected for display, such as the tracks pertaining to dialog, music, or effects.

Figure 4:
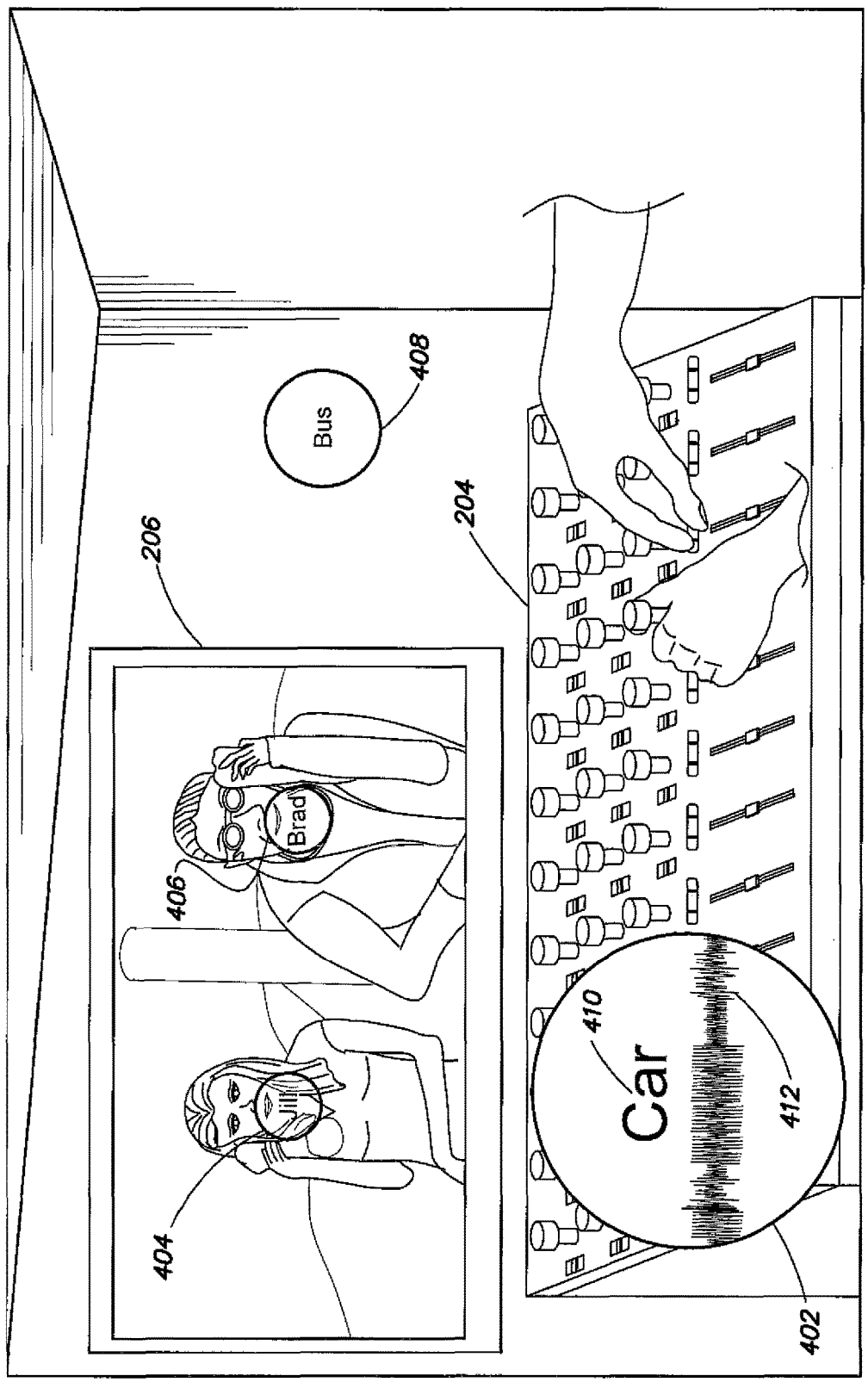
FIG. 4 illustrates the display of multiple parameters of audio channels within virtual objects representing the spatial location of each channel on a heads-up display.

In addition to the 3D location of a track, the heads-up display can display additional information pertaining to a track, such as track name, waveform, clipping indication, sound field size, and, for stereo tracks, an XY plot. This is illustrated in FIG. 4, which shows an augmented reality representation of four tracks 402, 404, 406, 408, together with further information. Sphere 402 includes track name 410, and a representation of track waveform 412. Tracks 404 and 406 are named after the actors whose voice they represent, and their location accordingly coincides with position of the corresponding actors on the screen. The track represented by sphere 408 named "bus" indicates an off-screen location of the sound source.

Figure 5:
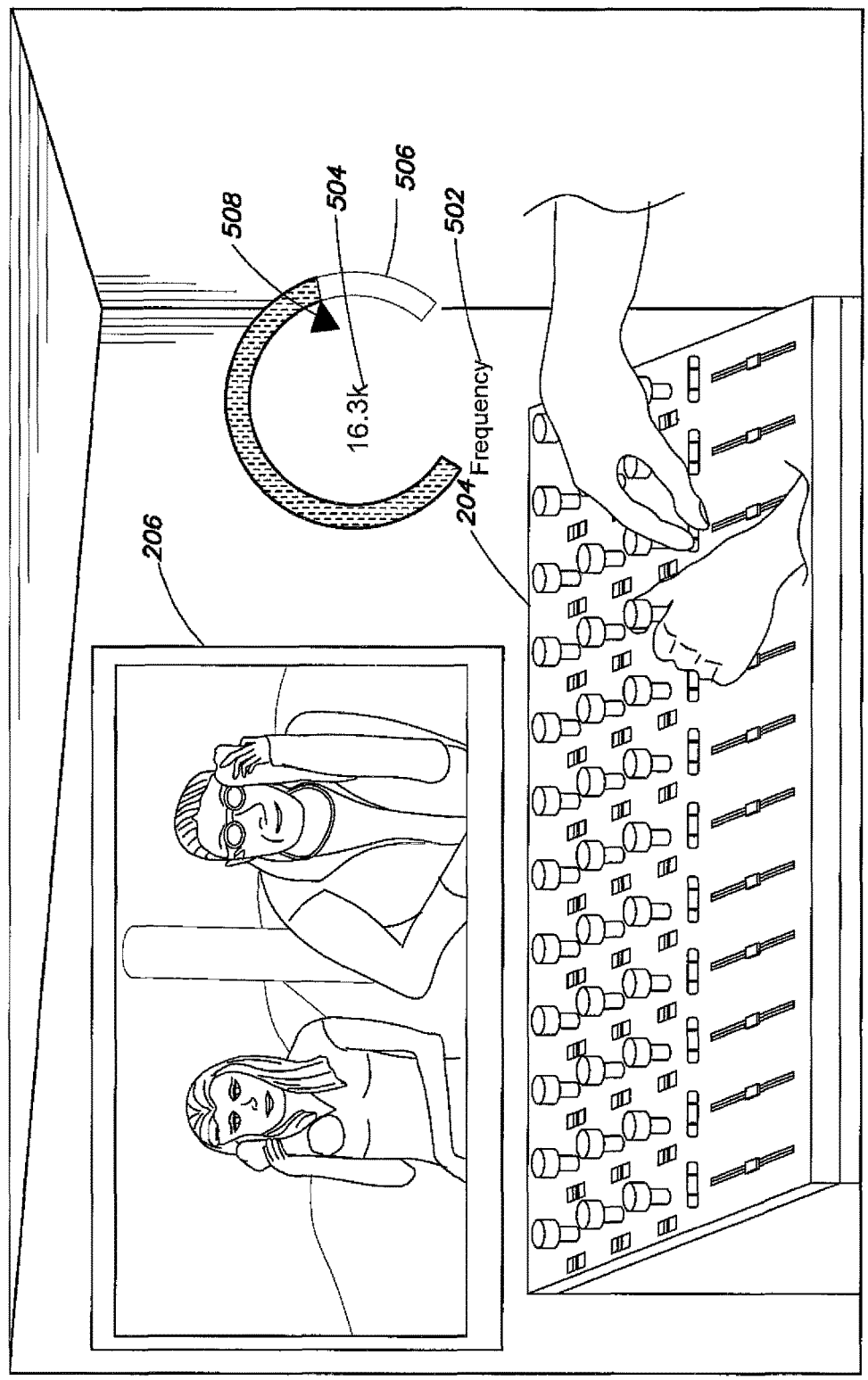
FIG. 5 illustrates the use of a heads-up display of a graphical representation of an audio parameter value that is being adjusted with a control of an audio mixing console.

To allow the sound engineer to keep their eyes on the screen, a large heads-up display of the name and parameter value of a control being manipulated may be shown. This contrasts with the traditional method in which the engineer needs to focus on a small OLED display on the console to read the parameter value. This application is illustrated in FIG. 5, in which parameter name 502, numerical parameter value 504, and analog graphical representation 506 of the parameter value are shown on the heads-up display. When a parameter value is adjusted, the control system determines which parameter is to be displayed on the heads-up display by inspecting a signal received from the mixing console. An alternative method is to provide a mapping from the physical position of the console to the augmented reality display. This requires that a configuration routine is run in which the system is explicitly told where each of the controls on the console is located. This may be done in absolute space when the console is fixed in place, or in relative space defined with respect to a reference feature in the console. One method of telling the system where each control is located involves enabling the user to position on a display icons representing each module of the control surface and then having the system request that the user manipulate a control on each of the modules when requested to do so by the system. This enables the system to tie a network address to the physical location of each of the modules of the mixing console. This method is described in U.S. patent application Ser. No. 13/836,456, which is wholly incorporated herein by reference. The location of each control on a given module with respect to a reference point on the module may be determined from the specifications of the module. The location of the console itself may be specified by defining the location of one or more corners or edges of the console. This may be achieved by referring to a spatial map of the room generated by the spatial mapping device in the augmented reality smart glasses. If more than one mapped shape resembles a console, the object closest to the wearer of the smart glasses is identified as the mixing console. Alternatively, the user can let the system know where the reference points are by gazing at each reference point in turn with the smart glasses and activating a control when ready to transmit the position to the computer hosting the augmented reality software. The system combines the gaze direction with the spatial map to determine the reference point locations.

The augmented reality control software requires data defining the boundary of the room in which the mixing is being performed in order to render the objects representing sound track locations correctly with respect to the room. For example, when panning the apparent location of a sound source within the room, the object representing the track needs to appear at the corresponding room location in the heads-up display. Methods for identifying room dimensions to an augmented reality system include spatial mapping methods, such as those described by Microsoft in connection with its HoloLens head-mounted display. Various spatial mapping methods use infrared beams to map the room in three dimensions, and build model of walls, the mixing console, and, in a dub stage, the screen. Metadata associated with the picture may define the spatial position of sound sources that appear within the picture. The augmented reality controller may receive such metadata and use it to correctly position augmented reality representations of the sound sources so as to coincide with their corresponding source objects in the picture. Off-screen sound sources, such channel 408 in FIG. 4 representing a bus can be positioned in a similar fashion, either using metadata received with the video being dubbed, or by relying on the three-dimensional spatial map of the room generated by the augmented reality smart glasses.

The shape of a virtual graphical element may also be used to represent a parameter value. Referring to the example illustrated in FIG. 5, the value of the parameter, i.e., frequency, is represented by the length of the purple arc. Another parameter that controls the bandwidth of a filter that controls the gain at that frequency, which is commonly referred to as Q, may be represented by a shape of the virtual arc; for example, a fatter arc may refer to a wider bandwidth (which corresponds to a lower Q value). Alternatively, a second virtual object having a similar arc shape to that shown in FIG. 5, but symmetrically disposed about the vertical axis may be used to represent Q, with a longer arc indicating wider bandwidth (lower Q). The thickness of virtual pointer 508 may also be used to represent the Q value.

Figure 6:
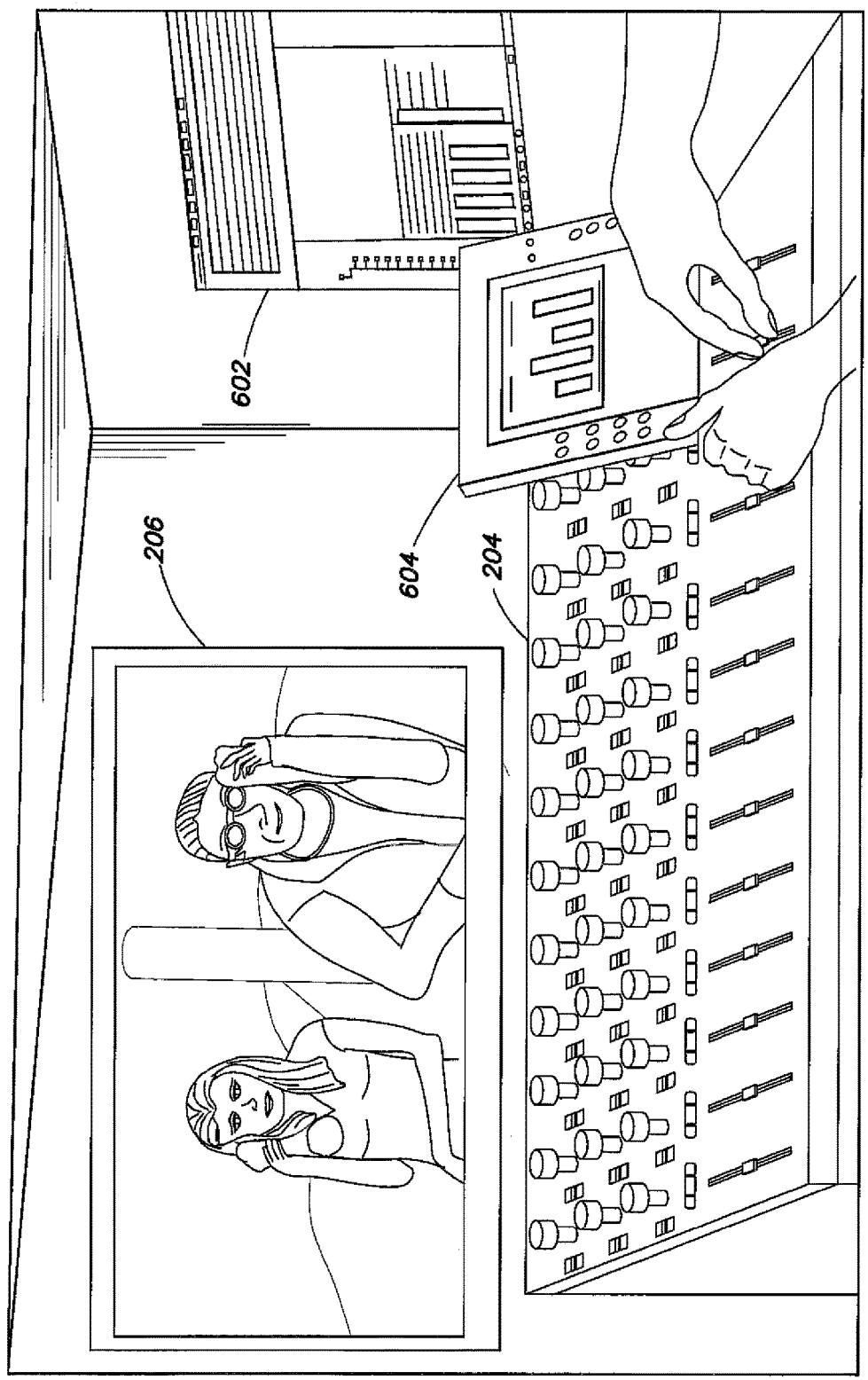
FIG. 6 illustrates the display of a user interface of a digital audio workstation on a heads-up display.

Augmented reality glasses 108 may display some or all of the user interface of a digital audio workstation that the engineer is using via the console to perform the mixing. This can be "pasted" onto a convenient surface in the physical room, at any desired size. FIG. 6 illustrates user interface 602 of Pro Tools®, a digital audio workstation from Avid® Technology Inc., Burlington, Mass., appearing in the augmented reality display as projected onto a wall on the engineer's right. This obviates the need for a monitor to be purchased and mounted onto the console for showing the digital audio workstation interface. The figure shows display 604 on the console, which is instead available for other functions, such as in configuring the console and showing selected track parameter values. Display 604 is included in the augmented reality system's spatial map of the room, enabling to simulate occlusion of parts of wall display 602 in a manner consistent with the user's head position. In order to ensure that virtual monitor display 602 does not cover something that the user needs to see, the location of the virtual monitor is pinned to the physical environment. Thus, it stays in the same location with respect to the physical environment regardless of the user's head movements.

Figure 7:
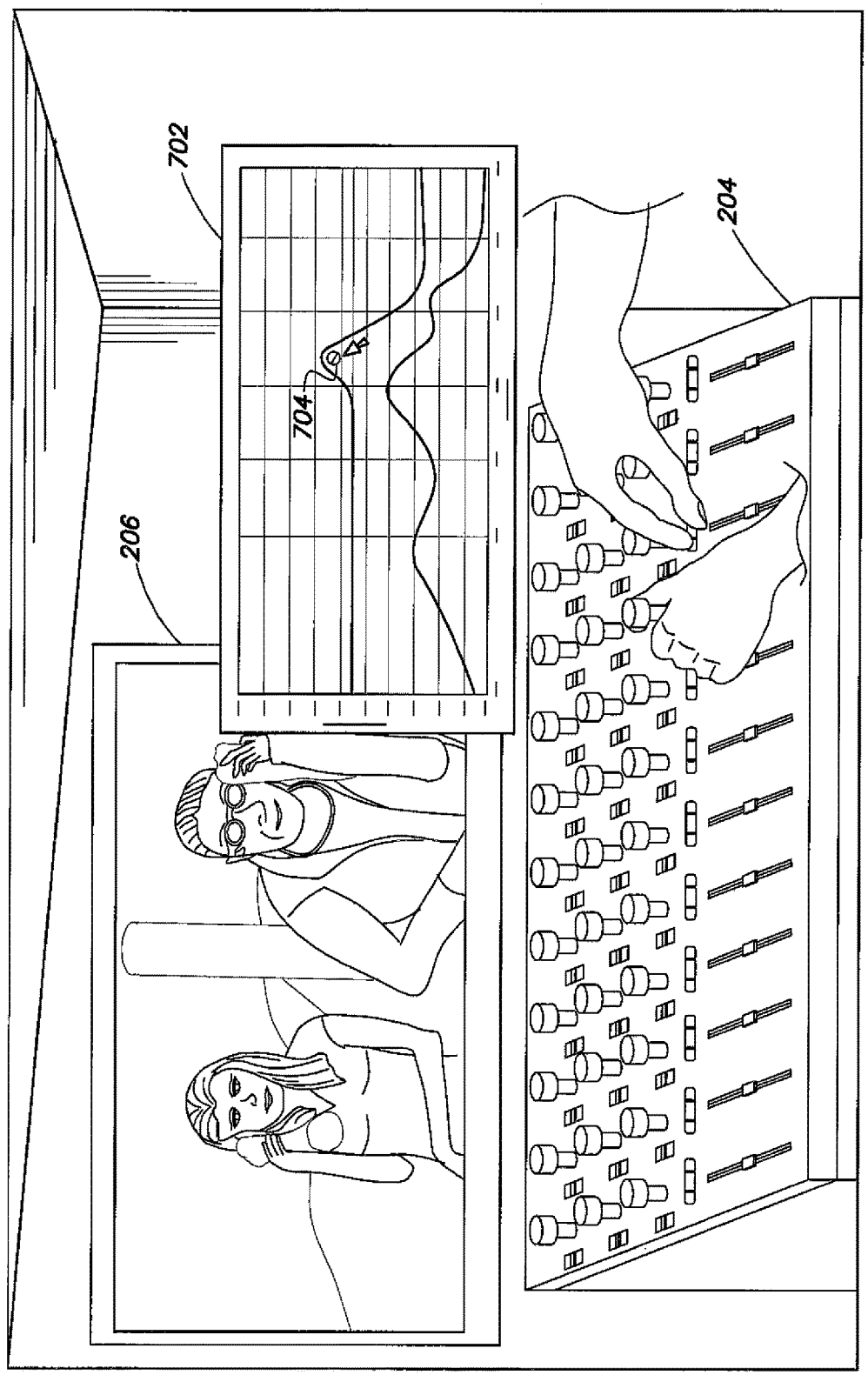
FIG. 7 is an illustration of the display of an audio equalization graph on a heads-up display.

FIG. 7 shows heads-up equalization (EQ) graph 702, which may be displayed when the engineer manipulates a physical EQ control on the console. The EQ may be manipulated in the traditional fashion using physical controls on the console, or the user may directly manipulate the EQ graph using three-dimensional movements of body parts, including gaze direction, and arm, hand, and finger movements. These movements are tracked by head position sensor (FIG. 1, 110) for gaze direction, and by hand/finger position sensor 114, and relayed to control system 106. In one implementation of direct manipulation of parameters using the virtual objects in the virtual reality display, a gaze direction is used to control the position of cursor 704. The user then performs a hand/finger gesture to select that position, e.g., by making a pinching or tapping gesture with their fingers. The select command could also be performed via voice control or using a switch or button in a hand-held controller. The EQ graph shown in FIG. 7 may then be manipulated by using the hand to drag the cursor, which in turn alters the shape of the graph, adjusting the frequency (x-axis) and gain (y-axis). In addition to EQ parameters, various other audio mixing parameters, such as dynamics parameters, gain, auxiliary send level, and pan may be manipulated directly in a similar fashion. A similar heads-up window showing the user interface of a plug-in software module may be displayed instead of or alongside the EQ window, with the plug-in parameters controlled either via the mixing console directly, as described above.

Technologies for implementing direct control of virtual objects in an augmented reality environment involve the use of head-mounted displays, hand-controllers, hand gloves, and other body-mounted sensors for tracking user movements. The sensors may use visible light optical image sensors, infrared, electromagnetic fields, sonar, GPS, accelerometers, or gyroscopes to map the environment and track and relay user motions within three-dimensional space.

Figure 8:
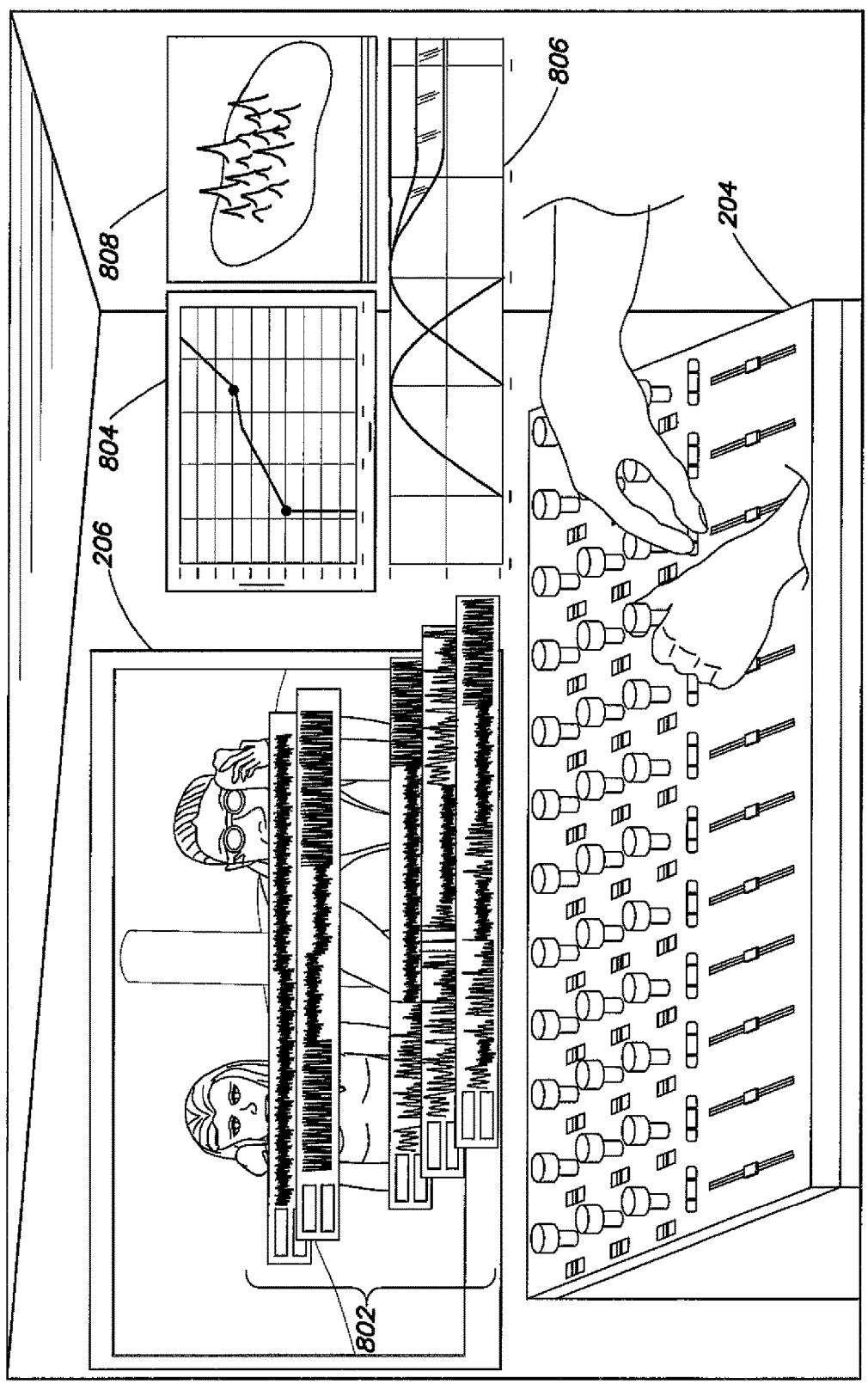
FIG. 8 is an illustration of the display of visualizations of multiple mixing parameters using a heads-up display.

Windows shown in the heads-up display may be stacked in front of each other. As an example of this, FIG. 8 shows tracks in VCA groups 802. The z direction may be used to present additional information, or to enable members of the VCA group to be accessed quickly. As a default, louder tracks may be placed nearer the front in the stack. Track ordering may adhere to conventions, such as for a drum kit VCA group. Alternatively, the track representations may be organized in the z direction by user grouping, e.g., drums, vocals, effects. FIG. 8 804 also shows heads-up display representations of dynamics graph and input gain meters as well as filter response curves 806 and three dimensional spectrograms of one or more tracks 808. The spectra may be rotated in three dimensions to show the desired information more clearly. The user interfaces of one or more plug-in software modules used in conjunction with the mixing console and/or the media processing application may also be shown in the augmented reality display. The third dimension represented in the heads-up display may be used to help separate windows that would normally be adjacent to each other, this providing a clearer interface. The representation of track positions, such as with the spheres illustrated in FIGS. 2-4 may be combined with any of the other data display and manipulation examples discussed.

Further applications of augmented reality in audio mixing include the following. Pan positions and other parameters may be directly manipulated by the user. In some implementations, the augmented reality control system recognizes objects within the video, determines their spatial positions within the frame, and passes this information to the mixing console which can use this to perform automatic panning of sound. The augmented reality control system also updates the augmented reality graphical representation of the sound corresponding to the recognized objects, following the object's movement on the screen. Examples of objects associated with sound that may be tracked include people, animals, and vehicles within the scene.

To help focus attention, multiple operators working on a film mix may only see the tracks for which they are responsible. For example, a dialog editor, music editor, or effects editor is only able to see their corresponding tracks represented in the heads-up display. A meter bridge may be positioned in the room at any desired size. In another application, the operator may move around a performance venue and, when the system determines using the 3D position sensor in combination with the spatial map of the venue that the operator has approached an object, it may recognize the object and display information pertaining to that object on the heads-up display. For example, when approaching and/or looking at loudspeaker, the level and/or frequency response of the speaker is displayed. Looking at a microphone causes attributes of a track associated with that microphone to be displayed, such as name, level, frequency response, EQ, dynamics settings, mute, and input gain. In the same fashion, attributes of tracks associated with a performer having a lavalier microphone, or an instrument may be retrieved and displayed when the user approaches or looks at the performer in physical space.

The various components of the system described herein may be implemented as a computer program using a general-purpose computer system. Such a computer system typically includes a main unit connected to both an output device that displays information to a user and an input device that receives input from a user. The main unit generally includes a processor connected to a memory system via an interconnection mechanism. The input device and output device also are connected to the processor and memory system via the interconnection mechanism.

One or more output devices may be connected to the computer system. Example output devices include, but are not limited to, liquid crystal displays (LCD), plasma displays, various stereoscopic displays including displays requiring viewer glasses and glasses-free displays, cathode ray tubes, video projection systems and other video output devices, printers, devices for communicating over a low or high bandwidth network, including network interface devices, cable modems, and storage devices such as disk or tape. One or more input devices may be connected to the computer system. Example input devices include, but are not limited to, a keyboard, keypad, track ball, mouse, pen and tablet, touchscreen, camera, communication device, data input devices, and position sensors mounted on an operator's head, hands, arms, or other body parts. The invention is not limited to the particular input or output devices used in combination with the computer system or to those described herein.

The computer system may be a general-purpose computer system, which is programmable using a computer programming language, a scripting language or even assembly language. The computer system may also be specially programmed, special purpose hardware. In a general-purpose computer system, the processor is typically a commercially available processor. The general-purpose computer also typically has an operating system, which controls the execution of other computer programs and provides scheduling, debugging, input/output control, accounting, compilation, storage assignment, data management and memory management, and communication control and related services. The computer system may be connected to a local network and/or to a wide area network, such as the Internet. The connected network may transfer to and from the computer system program instructions for execution on the computer, media data such as video data, still image data, or audio data, metadata, review and approval information for a media composition, media annotations, and other data.

A memory system typically includes a computer readable medium. The medium may be volatile or nonvolatile, writeable or nonwriteable, and/or rewriteable or not rewriteable. A memory system typically stores data in binary form. Such data may define an application program to be executed by the microprocessor, or information stored on the disk to be processed by the application program. The invention is not limited to a particular memory system. Time-based media may be stored on and input from magnetic, optical, or solid state drives, which may include an array of local or network attached disks.

A system such as described herein may be implemented in software, hardware, firmware, or a combination of the three. The various elements of the system, either individually or in combination may be implemented as one or more computer program products in which computer program instructions are stored on a computer readable medium for execution by a computer, or transferred to a computer system via a connected local area or wide area network. Various steps of a process may be performed by a computer executing such computer program instructions. The computer system may be a multiprocessor computer system or may include multiple computers connected over a computer network. The components described herein may be separate modules of a computer program, or may be separate computer programs, which may be operable on separate computers. The data produced by these components may be stored in a memory system or transmitted between computer systems by means of various communication media such as carrier signals.

Having now described an example embodiment, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention.

What is claimed is:

1. A method of mixing a plurality of audio channels of a media project, the method comprising:
providing a physical mixing console for mixing the plurality of audio channels of the media project;
providing smart glasses for an operator of the physical mixing console, wherein the physical mixing console and the smart glasses are in data communication with a computer hosting augmented reality software;
while the operator is wearing the smart glasses, displaying on the smart glasses a graphical representation of a spatial location of a source of a given audio channel, wherein the graphical representation of the spatial location of the source of the given audio channel appears to the operator to be positioned at a spatial location within a three-dimensional space surrounding the operator and the physical mixing console; and
enabling the operator to adjust the spatial location of the source of the given audio channel with respect to the three-dimensional space, wherein the graphical representation of the spatial location of the source of the given audio channel is updated in response to an operator using a combination of a knob and a joystick of the physical mixing console to adjust the spatial location.

2. The method of claim 1, wherein the operator is able to adjust the location of the source of the given audio channel by manipulating a physical control on the physical mixing console.

3. The method of claim 1, wherein the operator is able to adjust the spatial location of the source of the given audio channel by touching a touchscreen control on the physical mixing console.

4. The method of claim 1, wherein the operator is able to adjust the spatial location of the source of the given audio channel by using gestures that appear to interact in the three-dimensional space with the graphical representation of the spatial location of the source of the given audio channel.

5. The method of claim 1 wherein a size of the graphical representation of the spatial location of the source of the given audio channel is indicative of a distance of the source of the given audio channel from the operator.

6. The method of claim 1 wherein a shape of the graphical representation is indicative of a value of a parameter of the given audio channel.

7. The method of claim 1 wherein a color of a graphical representation is indicative of a value of a parameter of the given audio channel.

8. The method of claim 1, wherein the graphical representation of the spatial location of the given audio channel includes a name of the given audio channel.

9. The method of claim 1 wherein:
the media project comprises time-synchronous video and audio;
the time-synchronous video is displayed on a display within the three-dimensional space surrounding the operator and the mixing console;
a source object for the given audio channel is depicted in the displayed time-synchronous video; and
the spatial location of the graphical representation of the source of the given audio channel appears to coincide with a spatial location within the displayed time-synchronous video of the depicted source object.

10. The method of claim 1, wherein the graphical representation of the spatial location of the source of the given audio channel is displayed within a graphical user interface of a media processing application, and the graphical user interface of the media processing application appears to the operator to be positioned on a surface of the three-dimensional space surrounding the operator.

11. The method of claim 1, further comprising displaying on the smart glasses graphical representations of values of a plurality of audio mixing.

12. The method of claim 1, wherein the computer is embedded within the physical mixing console.

13. A system for audio mixing comprising:
a control system in data communication with augmented reality smart glasses and with a physical mixing console, wherein:
the augmented reality smart glasses include a three-dimensional position sensor;

the physical mixing console is configured to enable an operator using a combination of a knob and a joystick to adjust a spatial location of a source of a given audio channel of media project;

the control system is configured to:
- receive from the physical mixing console information defining an adjusted spatial position of the source of the given audio channel;
- in response to receiving the information defining the adjusted spatial position of the source of the given audio channel, generate data representing a graphical representation of the adjusted spatial position of the source of the given audio channel; and
- send the data representing the graphical representation of the adjusted spatial position of the given audio channel to the augmented reality smart glasses; and the augmented reality smart glasses receive the data representing the graphical representation of the adjusted spatial position of the source of the given audio channel and display the graphical representation of the adjusted spatial position of the source of the given audio channel so that it appears to the operator to be located within a three-dimensional space that surrounds the operator and the mixing console.

14. The system of claim 13, wherein the operator uses a control of the physical mixing console to adjust the spatial location of the given audio channel.

15. The system of claim 13, further comprising a three-dimensional position sensor in data communication with the control system, wherein:

the three-dimensional position sensor tracks a movement of the operator and sends data representing the tracked movement to the control system;

the control system in real-time:
- interprets the tracked movement as an instruction to adjust the spatial position of the source of the given audio channel and generates in real-time data representing a graphical representation corresponding to an adjusted spatial position of the source of the given audio channel; and
- sends the data representing the graphical representation of the adjusted spatial position to the augmented reality smart glasses; and the augmented reality smart glasses receive the data representing the graphical representation of the adjusted spatial position and display the graphical representation of the adjusted spatial position.

* * * * *